United States Patent
Nagano et al.

(10) Patent No.: US 6,232,131 B1
(45) Date of Patent: *May 15, 2001

(54) METHOD FOR MANUFACTURING SEMICONDUCTOR DEVICE WITH FERROELECTRIC CAPACITORS INCLUDING MULTIPLE ANNEALING STEPS

(75) Inventors: Yoshihisa Nagano; Eiji Fujii, both of Osaka; Yasuhiro Uemoto, Shiga, all of (JP)

(73) Assignee: Matsushita Electronics Corporation, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/103,961

(22) Filed: Jun. 24, 1998

(51) Int. Cl.$^7$ .......................... H01L 21/8242; H01G 7/06
(52) U.S. Cl. ................. 438/3; 438/240; 438/656
(58) Field of Search .................. 438/3, 240–241, 438/238–256, 381–399, 648, 656, 683

(56) References Cited

U.S. PATENT DOCUMENTS

| | | |
|---|---|---|
| 5,135,608 | 8/1992 | Okutani . |
| 5,468,684 | * 11/1995 | Yoshimori et al. . |
| 5,624,864 | 4/1997 | Arita et al. . |
| 5,689,126 | 11/1997 | Takaishi . |
| 5,716,875 | * 2/1998 | Jones, Jr. et al. ................ 438/3 |
| 5,837,591 | * 11/1998 | Shimada et al. ............... 438/381 |
| 5,879,981 | * 3/1999 | Tanigawa ........................ 438/241 |

FOREIGN PATENT DOCUMENTS

| | | |
|---|---|---|
| 3-180040 | 8/1991 | (JP) . |
| 7-221070 | 8/1995 | (JP) . |
| 7-226443 | 8/1995 | (JP) . |
| 8-153707 | 6/1996 | (JP) . |
| 8-296067 | 11/1996 | (JP) . |
| 9-279367 | 10/1997 | (JP) . |
| 10-22464 | 1/1998 | (JP) . |

OTHER PUBLICATIONS

Wolf et al. Silicon processing for the VLSI era, vol. 1, pp 57–58, Lattice Press, 1986.*

* cited by examiner

Primary Examiner—Jey Tsai
(74) Attorney, Agent, or Firm—Merchant & Gould P.C.

(57) ABSTRACT

The method for manufacturing a semiconductor device of this invention comprises the steps: forming a first wiring layer on a semiconductor substrate on which a capacitor element with a capacitor dielectric film is formed, and the capacitor dielectric film is at least one film selected from the group consisting of a capacitor dielectric film with high dielectric constant and a ferroelectric film; conducting a first annealing to said semiconductor substrate; forming a second wiring layer on said first wiring layer; etching selectively the first wiring layer and the second wiring layer; and conducting a second annealing to the semiconductor substrate, so that the stress provided to the capacitor element can be reduced by annealing after forming each wiring layer, and thus, it can prevent the increase of leakage current and deterioration of dielectric breakdown voltage of the capacitor element having a capacitor dielectric film comprising a high capacitor dielectric film and a ferroelectric film.

14 Claims, 4 Drawing Sheets

METHOD FOR MANUFACTURING SEMICONDUCTOR DEVICE WITH FERROELECTRIC CAPACITORS INCLUDING MULTIPLE ANNEALING STEPS

FIELD OF THE INVENTION

The present invention relates to a method for manufacturing a semiconductor device comprising a built-in capacitor element having a capacitor dielectric film selected from the group consisting of a capacitor dielectric film with high dielectric constant and a ferroelectric film.

BACKGROUND OF THE INVENTION

Consumer electronic equipment has been further advanced in the recent trend of high-speed and low power consumption for microcomputers etc., and semiconductor elements for semiconductor devices used in such computers are also miniaturized rapidly. Accordingly, unwanted radiation, that is, electromagnetic wave noise generated from electronic equipment, has been a serious problem. As a measure to decrease such unwanted radiation, a technique to build capacitor elements with large capacity in semiconductor integrated circuit devices and the like has attracted attention. Such capacitor elements have capacitor dielectric films of dielectric with high dielectric constant (hereinafter, high dielectric). With the trend of high integration of dynamic RAM, a technique to use high dielectric materials for a capacitor dielectric film instead of conventional silicon oxides or nitrides is widely researched. Moreover, research and development concerning ferroelectric films having spontaneous polarization property has been popular in order to practically apply a non-volatile RAM that enables writing and reading with lower working voltage and higher speed compared to conventional devices.

A method for manufacturing a conventional semiconductor device is explained below referring to FIGS. 4A to 4D. FIGS. 4A–4D are cross-sectional views showing the process of manufacturing a conventional semiconductor device.

As shown in FIG. 4A, a separation oxide film 2, a diffusion area 3 to be a source and drain for a transistor, a gate electrode 4 comprising polysilicon, and an interlayer capacitor dielectric film 5 comprising a silicon oxide film etc., are formed on a silicon substrate 1, on which a lower electrode 6a comprising a multilayer of titanium and platinum, a capacitor dielectric film 6b comprising a ferroelectric film such as PZT (lead (Pb) zirconate titanate) and $SrBi_2Ta_2O_9$ and the like are formed throughout. Then, each layer is etched to have a desirable pattern by dry-etching such as ion milling using argon ions, so that a capacitor element 6 is formed. Next, as shown in FIG. 4B, an interlayer dielectric film 7 for the capacitor element is formed on the whole surface, and also formed contact holes 8 to reach a diffusion area 3, lower electrode 6a and upper electrode 6c. Next, as shown in FIG. 4C, a first wiring layer 9 and a second wiring layer 10 are formed on the whole surface. The first wiring layer is a diffusion barrier layer to restrain eutectic reaction between platinum used for the electrode material of the capacitor element and aluminum used for the second wiring layer, and comprises titanium nitride. Subsequently, the first wiring layer 9 and the second wiring layer 10 are etched selectively and then, annealed in a nitrogen atmosphere at 450° C. to relieve the stress applied to the capacitor element.

In the semiconductor device manufactured in the conventional method, however, the stress provided to the capacitor element is still great even by annealing after forming the first and second wiring layers, and thus, the leakage current of the capacitor element increases and the dielectric breakdown volume is lowered.

SUMMARY OF THE INVENTION

In order to solve the above problems, this invention aims to provide a method for manufacturing a semiconductor device to prevent increase of leakage current and deterioration of the dielectric breakdown voltage of a capacitor element having a capacitor dielectric film of either a high dielectric or a ferroelectric, even if a wiring layer is formed.

In order to achieve the above objects, a method for manufacturing a semiconductor device of this invention comprises the following steps of:

forming a first wiring layer on a semiconductor substrate formed thereon a capacitor element having at least one capacitor dielectric film selected from the group consisting of a capacitor dielectric film with high dielectric constant and a ferroelectric film;

conducting a first annealing to the semiconductor substrate;

forming a second wiring layer on the first wiring layer;

selectively etching the first wiring layer and second wiring layer; and conducting a second annealing to the semiconductor substrate.

In this invention, stress provided to the capacitor element can be reduced by annealing after the formation of each wiring layer, and thus, increase of leakage current and deterioration of dielectric breakdown volume of the capacitor element having a capacitor dielectric film of either a high capacitor dielectric film or a ferroelectric film can be prevented.

High dielectric constant in this invention is no less than 50 of dielectric constant.

In the embodiment of this invention, the first annealing step is conducted in an atmosphere of an inert gas such as nitrogen, argon and a mixture thereof, or in a vacuum of no more than 10 Torr, so that the stress to the capacitor element can be reduced without raising the resistance of the wiring layers.

In the embodiment of this invention, a heat chamber is used to maintain the temperature for the first annealing in the range from 300° C. to 450° C., so that the stress to the capacitor element can be reduced without deteriorating the characteristics of the transistor.

In the embodiment of this invention, the first annealing is conducted by a rapid thermal annealing (RTA) at a temperature ranging from 450° C. to 550° C., so that the stress to the capacitor element can be reduced without deteriorating the characteristics of the transistor even at a relatively high temperature.

In the embodiment of this invention, it is preferable that the RTA is conducted by raising temperature by lamp-heating at a rate of 50° C.–150° C./second.

In the embodiment of this invention, the first wiring layer is selected from the group consisting of titanium nitride, titanium-tungsten, a multilayer of titanium and titanium nitride, and a multilayer of titanium and titanium-tungsten.

In the embodiment of this invention, the second wiring layer is a metal layer containing aluminum.

In the embodiment of this invention, the second annealing is conducted in an atmosphere of an inert gas such as nitrogen, argon and a mixture thereof, or in a vacuum, so that the stress to the capacitor element can be reduced without raising the resistance of the wiring layer.

In the embodiment of this invention, a heat chamber is used to maintain the temperature for the second annealing in the range from 300° C. to 450° C., so that the stress to the capacitor element can be reduced without deteriorating the characteristics of the transistor.

In the embodiment of this invention, the second annealing is conducted by RTA at a temperature ranging from 450° C. to 550° C., so that the stress to the capacitor element can be reduced without deteriorating the characteristics of the transistor even at a relatively high temperature.

In the embodiment of this invention, it is preferable that the RTA is conducted by raising temperature by lamp-heating at a rate of 50° C.–150° C./second.

In one embodiment of this invention, it is preferable that the dielectric layer is at least one layer selected from the group consisting of $SrBi_2Ta_2O_9$, $SrBi_2(TaNb)_2O_9$, $(Pb,Zr)TiO_3$, $(Ba,Sr)TiO_3$, and $SrTiO_3$.

In the method of this invention, a semiconductor device with superior reliability is provided by annealing a substrate in an inert gas such as nitrogen, argon, a mixed gas comprising thereof, or in a vacuum after forming a first wiring layer throughout, and subsequently forming a second wiring layer. The semiconductor device can prevent increase of leakage current and deterioration of the dielectric breakdown voltage of the capacitor element having a capacitor dielectric film of either a high capacitor dielectric film or a ferroelectric film.

DESCRIPTION OF THE PREFERRED EMBODIMENTS

Figure 1A:
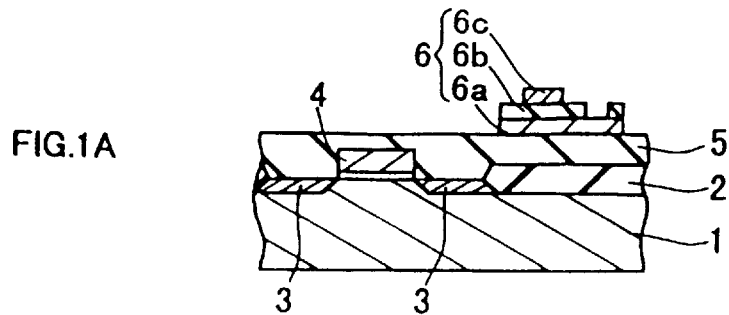
FIG. 1A is a cross-sectional view to show a step of forming a capacitor element in a method for manufacturing a semiconductor device in one embodiment of this invention.

In the following, the present invention is described more specifically referring to the drawings.

1. First Embodiment

Figure 1B:
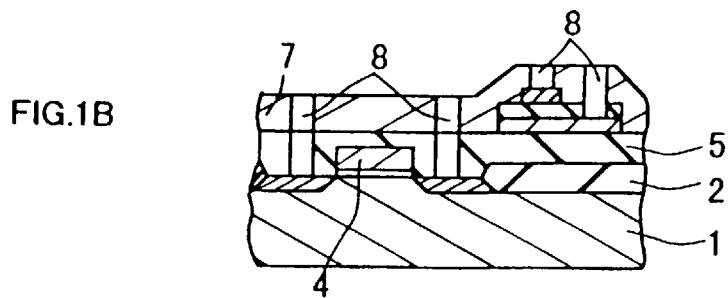
FIG. 1B is a cross-sectional view to show a step of forming an interlayer capacitor dielectric film and contact holes in the method for manufacturing a semiconductor device.

FIGS. 1A–1E are cross-sectional views to show the steps of manufacturing a semiconductor device in the first embodiment of this invention. On a silicon substrate 1, a separation oxide film 2, a diffusion area 3 to be a drain for a transistor, a gate electrode 4 comprising polysilicon and an interlayer capacitor dielectric film 5 comprising a silicon oxide layer etc. were formed sequentially as shown in FIG. 1A, on which a lower electrode 6a comprising a multilayer of titanium and platinum, a capacitor dielectric film 6b comprising a ferroelectric film such as PZT(lead (Pb) zirconate titanate) and $SrBi_2Ta_2O_9$, and an upper electrode 6c comprising platinum were formed throughout. Subsequently, the respective layers were etched to have desirable patterns by dry-etching such as ion milling using argon ions, so that a capacitor element 6 was formed. As shown in FIG. 1B, an interlayer dielectric film 7 for the capacitor element was formed on the whole surface and then formed contact holes 8 to reach the diffusion area 3, the lower electrode 6a and the upper electrode 6c. The upper electrode 6c can be a multilayer of platinum and Ti. In this case, when contact holes are formed on the interlayer dielectric film 7 formed on the upper electrode 6c, Ti, a part of the upper electrode, is also etched. The film thickness of the lower electrode 6a was about 300 nm in the Pt portion and about 20 nm in the Ti portion when Ti was located at lower side and Pt was at upper side. The thickness of the capacitor dielectric film was about 240nm. The film thickness of the upper electrode 6c was about 300 nm when it contained Pt only. When it was a multilayer film of Pt and Ti, Ti was about 20 nm and Pt was about 300 nm. For the thickness of the first wiring layer, TiN/Ti=about 150 nm/about 20 nm, and for the second wiring layer thickness, Al was about 800 nm.

Figure 1C:
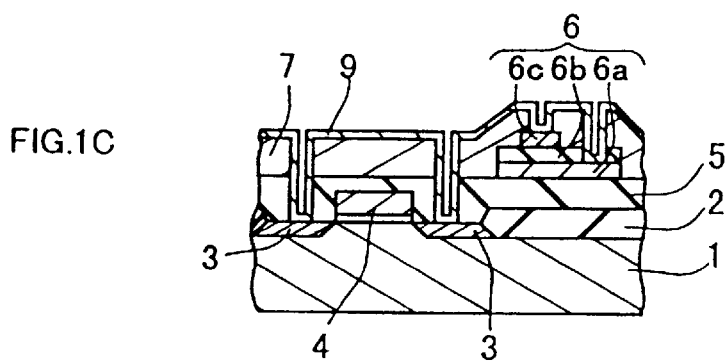
FIG. 1C is a cross-sectional view to show a step of forming a first wiring layer and annealing in the method for manufacturing a semiconductor device.
Figure 1D:
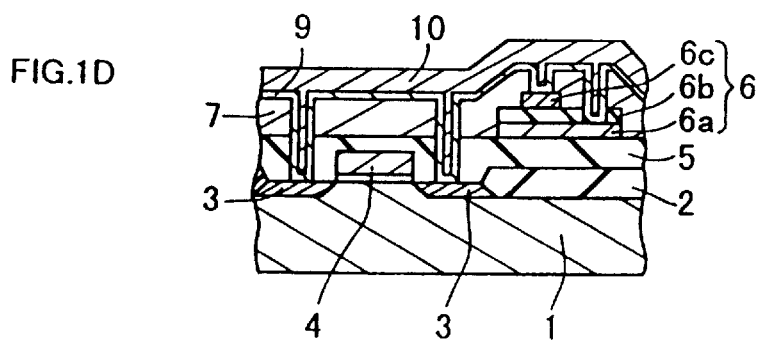
FIG. 1D is a cross-sectional view to show a step of forming a second wiring layer in the method for manufacturing a semiconductor device.

In the next step shown in FIG. 1C, the whole surface was covered with a first wiring layer 9, a diffusion barrier layer comprising a laminated layer of titanium and titanium nitride.

After that, a first annealing was conducted to decrease stress provided to the capacitor element 6. The first annealing was conducted by using a heat chamber in a nitrogen atmosphere for 60 minutes at 450° C.

Figure 1E:
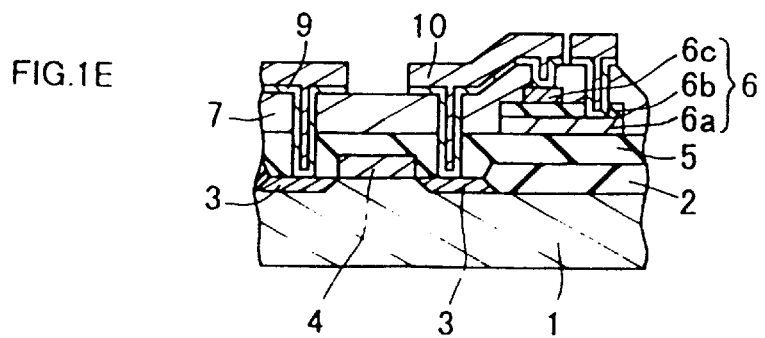
FIG. 1E is a cross-sectional view to show a step of wiring layer patterning and annealing in the method for manufacturing a semiconductor device.
Figure 2:
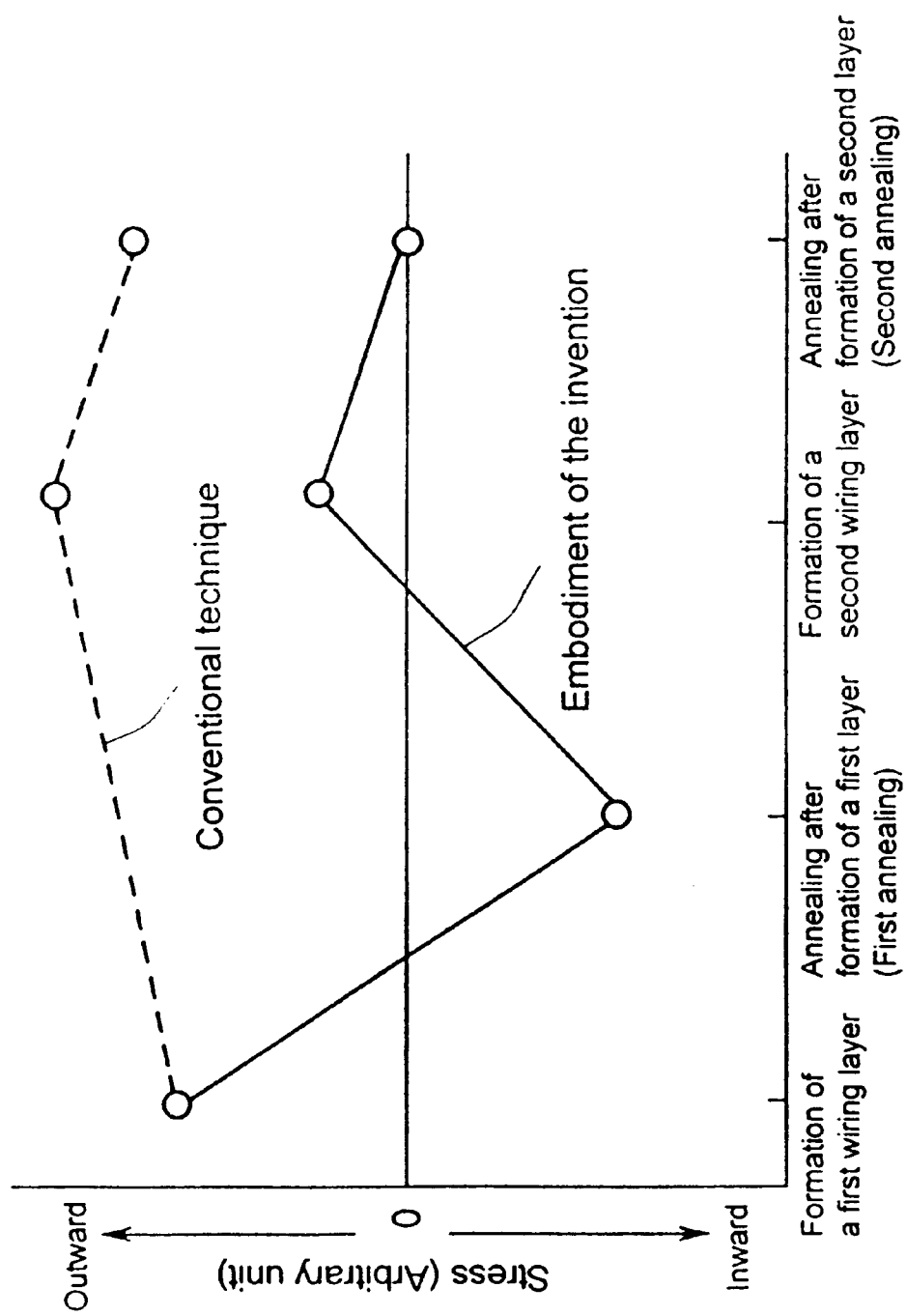
FIG. 2 is a graph to compare stress provided to a capacitor element of the embodiment of this invention and that of a conventional technique.
Figure 3:
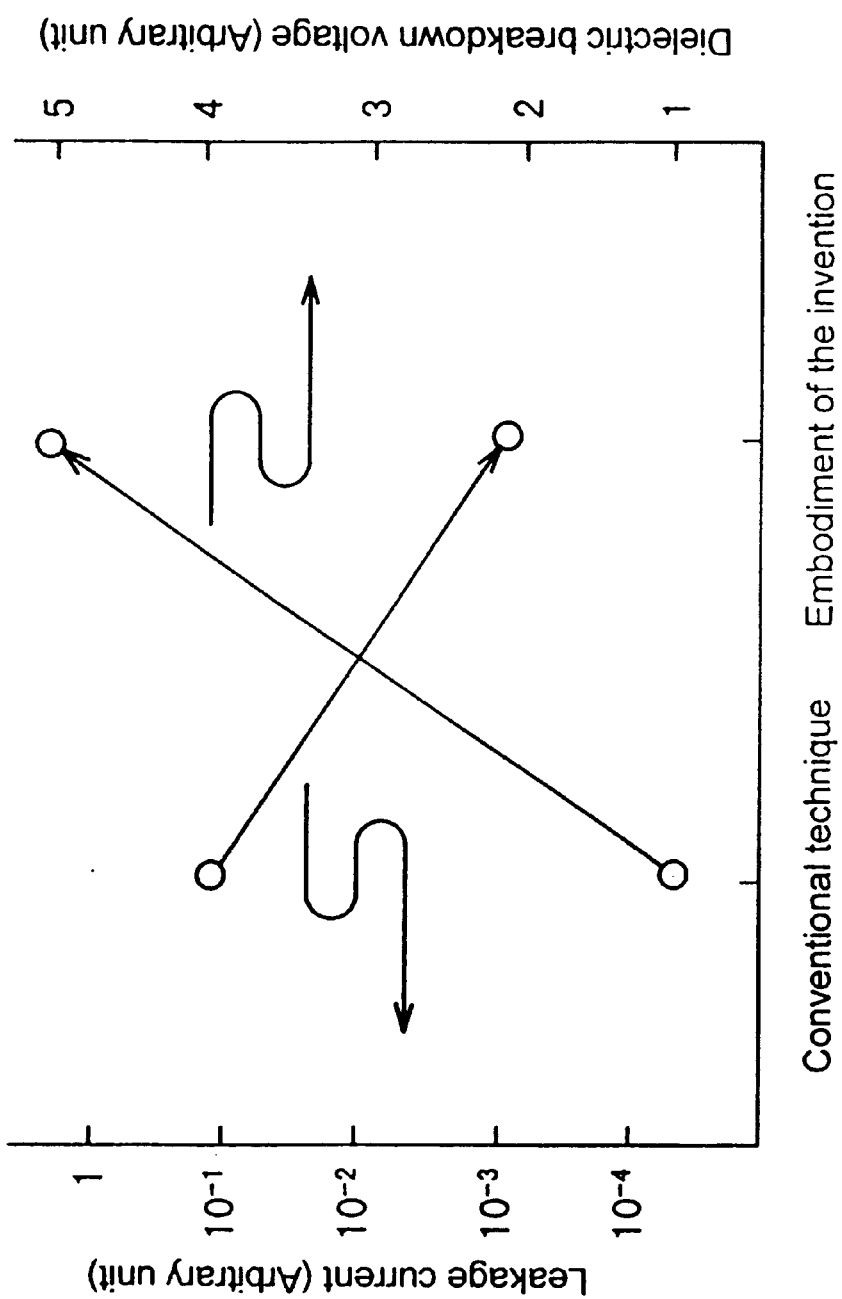
FIG. 3 is a graph to compare the leakage current and dielectric breakdown volume of the embodiment of this invention and those of a conventional technique.
Figure 4A:
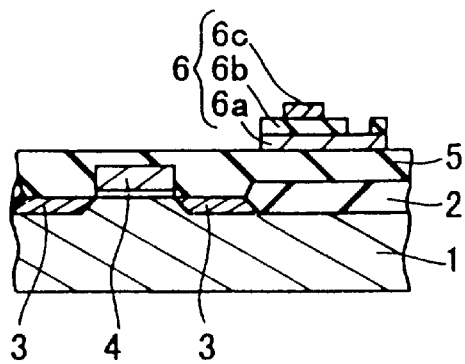
FIG. 4A is a cross-sectional view to show a step of forming a capacitor element in a conventional method for manufacturing a semiconductor device.
Figure 4B:
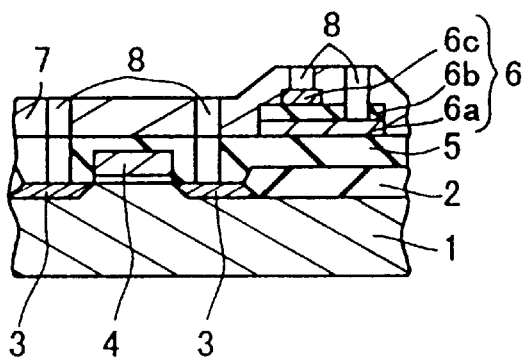
FIG. 4B is a cross-sectional view to show a step of forming an interlayer capacitor dielectric film and contact holes in the conventional method for manufacturing a semiconductor device.
Figure 4C:
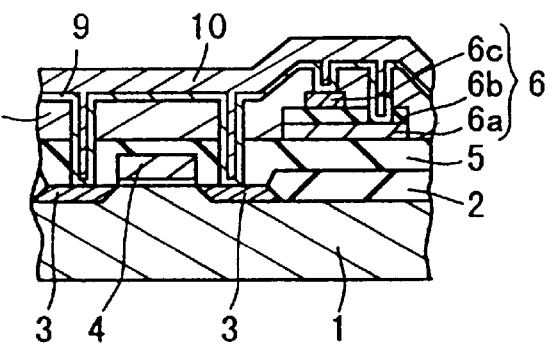
FIG. 4C is a cross-sectional view to show a step of forming a first wiring layer and a second wiring layer in the conventional method for manufacturing a semiconductor device.
Figure 4D:
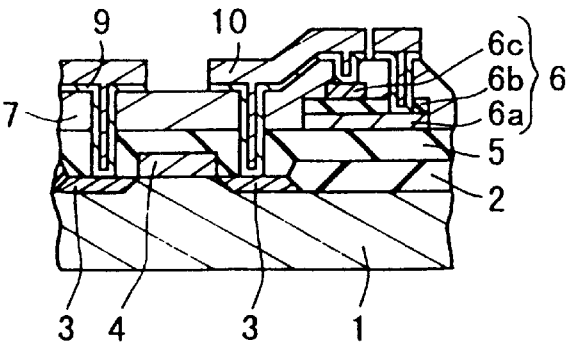
FIG. 4D is a cross-sectional view to show a step of wiring layer patterning and annealing in the method for manufacturing a conventional semiconductor device.

In the next step shown in FIG. ID, a second metal wiring layer 10 containing aluminum was formed on the whole surface. As shown in FIG. 1E, the first wiring layer and the second wiring layer were selectively etched, and finally a second annealing was conducted. The second annealing was conducted in a nitrogen atmosphere for 60 minutes at 450° C.

The first annealing was conducted in this embodiment after forming the first wiring layer 9, so that the stress applied to the capacitor element 6 due to only the first wiring layer 9 (a diffusion barrier layer) was reduced. Furthermore, the stress to the capacitor element 6 was reduced without raising the resistance of the wiring layer or deteriorating the ferroelectric film, by conducting the annealing in a nitrogen atmosphere.

A comparison was made between this embodiment and a conventional technique in the stress after the second annealing. When $SrBi_2Ta_2O_9$ was used for the capacitor dielectric film of the capacitor element 6, outward stress acted in the conventional technique while the stress in this embodiment was zero. When $SrBi_2Ta_2O_9$ was used for the capacitor dielectric film of the capacitor element 6, the leakage current was decreased by three digits and the dielectric breakdown volume was improved by five times. That is, the duration at a high electric field was sufficiently raised to a level for a practical use.

While the first annealing and second annealing were conducted by using a heat chamber at a temperature of 450° C. for 60 minutes, a preferable temperature range for the annealing steps was from 300° C. to 450° C. At a temperature lower than 300° C., stress was not be reduced effectively even if annealing was conducted. When annealing was conducted at a temperature higher than 450° C., titanium diffuses in the silicon at some parts such as a source or a drain of the transistor, or the parts contacting with the gate, and the electrical characteristics of the transistor deteriorates. Annealing at 300° C. should be conducted for approximately 100 hours in order to obtain the similar effect to the annealing at 450° C. for 60 minutes.

2. Second Embodiment

Rapid thermal annealing (RTA) can be used in the annealing step in the first embodiment.

In the RTA, the temperature at the substrate surface is rapidly raised by lamp-heating the surface, and lowering the temperature rapidly after maintaining for an extremely short time. In this method, the temperature rise inside the substrate can be restrained compared to the surface temperature. As a result, the wiring layers and the capacitor element can be annealed without the diffusion of titanium at the contacting parts in an annealing step at 450° C. or a higher temperature in this embodiment. More specifically, when annealing was conducted in the condition of RTA in which the temperature was raised to 550° C. for 60 seconds at a rate of 100° C. /second, the effect was the same as annealing at 450° C. for 60 minutes. The preferable temperature range for the RTA was from 450° C to 550° C. At a temperature lower than 450° C., stress was not reduced effectively by conducting RTA in a short time, while at a temperature higher than 550° C., temperature inside the substrate rose drastically, and the characteristics of the transistor deteriorated. An infrared ray lamp, for example, can be used, and the lamp power will be controlled corresponding to the temperature rising rate (50° C.–150° C. /second).

Though nitrogen was used for the atmosphere in the annealing steps in the embodiment, similar effects were obtained by using inert gases like argon, a mixture of nitrogen and argon, or by using a vacuum.

Though a multilayer film comprising titanium and titanium nitride was used for the first wiring layer, similar effects were obtained by using titanium nitride, a multilayer of titanium and titanium-tungsten, or titanium-tungsten.

Though the second annealing was conducted at 450° C. for 60 minutes in the above embodiment, similar effects was obtained by using RTA for the second annealing step. In this case, the preferable temperature also ranged from 450° C. to 550° C.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A method for manufacturing a semiconductor device comprising the steps of:

forming a first wiring layer comprising a titanium nitride or a titanium-tungsten layer on a semiconductor substrate on which a capacitor element having a capacitor dielectric film is formed, and the capacitor dielectric film is at least one film selected from the group consisting of a capacitor dielectric film with high dielectric constant and a ferroelectric film;

conducting a first annealing on said semiconductor substrate after forming the first wiring layer;

forming a second wiring layer on said first wiring layer after the first annealing;

etching selectively said first wiring layer and said second wiring layer; and conducting a second annealing on said semiconductor substrate on which the second wiring layer has been formed, wherein the temperature for the first annealing step ranges from 300° C. to 450° C. or rapid thermal annealing is conducted for the first annealing step to anneal at a temperature from 450° C. to 550° C.

2. The method for manufacturing a semiconductor device according to claim 1, wherein the atmosphere for the first annealing step is an inert gas atmosphere.

3. The method for manufacturing a semiconductor device according to claim 2, wherein the inert gas is at least one gas selected from the group consisting of nitrogen and argon.

4. The method for manufacturing a semiconductor device according to claim 1, wherein the atmosphere for the first annealing step is a vacuum of no more than 10 Torr.

5. The method for manufacturing a semiconductor device according to claim 1, wherein the temperature in the rapid thermal annealing is raised due to lamp heating at the rate of 50° C.–150° C. /second.

6. The method for manufacturing a semiconductor device according to claim 1, wherein said first wiring layer is at least one layer selected from the group consisting of a titanium nitride layer, a titanium-tungsten layer, a multilayer comprising titanium and titanium nitride, and a multilayer comprising titanium and titanium-tungsten.

7. The method for manufacturing a semiconductor device according to claim 1, wherein said second wiring layer is a metal layer containing aluminum.

8. The method for manufacturing a semiconductor device according to claim 1, wherein the atmosphere for said second annealing step is an inert gas atmosphere.

9. The method for manufacturing a semiconductor device according to claim 8, wherein the inert gas is at least one gas selected from the group consisting of nitrogen and argon.

10. The method for manufacturing a semiconductor device according to claim 1, wherein the atmosphere for the second annealing step is a vacuum of no more than 10 Torr.

11. The method for manufacturing a semiconductor device according to claim 1, wherein the temperature for the second annealing step ranges from 300° C. to 450° C.

12. The method for manufacturing a semiconductor device according to claim 1, wherein rapid thermal annealing is conducted for the second annealing step to anneal at a temperature from 450° C. to 550° C.

13. The method for manufacturing a semiconductor device according to claims 12, wherein the temperature in the rapid thermal annealing is raised due to lamp heating at the rate of 50° C.–150° C. /second.

14. The method for manufacturing a semiconductor device according to claim 1, wherein the capacitor dielectric film is at least one film selected from the group consisting of $SrBi_2Ta_2O_9$, $SrBi_2(TaNb)_2O_9$, $(Pb,Zr)TiO_3$, $(Ba,Sr)TiO_3$, and $SrTiO_3$.

* * * * *